United States Patent [19]

Shima et al.

[11] Patent Number: 4,780,660
[45] Date of Patent: Oct. 25, 1988

[54] APPARATUS FOR COMPENSATING REACTIVE POWER BY CURRENT-SOURCE TYPE CONVERTER

[75] Inventors: Seiya Shima; Hiromi Inabe; Sadao Hokari, all of Katsuta, Japan

[73] Assignee: Hitachi, Ltd., Tokyo, Japan

[21] Appl. No.: 101,021

[22] Filed: Sep. 25, 1987

[30] Foreign Application Priority Data

Sep. 26, 1986 [JP] Japan .............................. 61-226031
Oct. 8, 1986 [JP] Japan .............................. 61-237960

[51] Int. Cl.$^4$ .............................................. G05F 1/70
[52] U.S. Cl. .................................... 323/207; 323/205
[58] Field of Search ...................... 323/205, 207, 910; 318/729

[56] References Cited

U.S. PATENT DOCUMENTS

| | | | |
|---|---|---|---|
| 3,829,759 | 8/1974 | Thorborg | 323/207 |
| 3,900,792 | 8/1975 | Moltgen | 323/207 |
| 3,968,422 | 7/1976 | Waldmann | 323/207 |
| 4,600,874 | 7/1986 | Tupper et al. | 323/207 |

FOREIGN PATENT DOCUMENTS 125035 9/1980 Japan .

OTHER PUBLICATIONS

"General Analysis of Instantaneous Reactive Power and Application"; Periodical of the I.E.E. of Japan; vol. 103, No. 7, pp. 483–490.
"Operation Analysis and Designing of . . . Voltage-Source Type PWM Converter"; Periodical of the I.E.E. of Japan; vol. B106, No. 4, pp. 323–330.

Primary Examiner—Patrick R. Salce
Assistant Examiner—Jeffrey Sterrett
Attorney, Agent, or Firm—Antonelli, Terry & Wands

[57] ABSTRACT

A first apparatus for determining instantaneous reactive currents to determine instantaneous reactive currents in every phase of a three-phase load. Three phase current signals corresponding, respectively, to phase currents of the three-phase load supplied from a three-phase power-supply source are multiplied with sinusoidal wave signals of three phases, each of which has a phase difference of 90° relative to the corresponding phase voltage of the three-phase power supply source to obtain the products for three phase, respectively, which products are added together to produce a sum signal. The instantaneous reactive currents mentioned above are determined on the basis of the sum signal and the three phase sinusoidal wave signals. A second apparatus for compensating the reactive power of the three-phase load by means of a converter load circuit including a current-source type three phase converter connected in parallel with the three-phase load by making use of the instantaneous reactive currents of the three-phase load determined by the first mentioned apparatus.

4 Claims, 5 Drawing Sheets

APPARATUS FOR COMPENSATING REACTIVE POWER BY CURRENT-SOURCE TYPE CONVERTER

BACKGROUND OF THE INVENTION

The present invention generally relates to an apparatus for detecting an instantaneous (momentary) reactive current in a three-phase load and an apparatus for compensating a reactive power by means of a converter in which the instantaneous reactive current detecting apparatus is made use of. More particularly, the invention is concerned with an apparatus for compensating an instantaneous reactive power in a three-phase power supply source by means of a circuit including a current-source type converter connected in parallel with the three-phase load without exerting influence to the output voltage of the converter circuit.

A local electric system is extensively utilized in which a converter load circuit including a current-source type converter and a general purpose load circuit including conventional three-phase loads are connected in parallel with a three-phase power supply source. The converter load circuit mentioned above includes DC loads connected thereto through the current-source type converter or AC loads such as AC motors connected by way of an inverter circuit. In such electrical systems, many of the general purpose load circuits include various inductive loads which provide a cause for lowering the power factor, giving rise to generation of a corresponding reactive power which necessary imposes a burden on the three-phase power supply source. Under the circumstances, it would be very desirable if the reactive power could be compensated by the converter load circuit, since the burden imposed on the three-phase load due to the reactive power then could be mitigated, making it possible to reduce the capacity of the power supply equipment for a given effective power supply. In order to allow the reactive power to be compensated by means of the current-source type converter, it will be effective to compensate the reactive current corresponding to the reactive power through the current control by the converter circuit. To this end, it is necessary to detect the instantaneous reactive urrent in the general purpose load circuit and compensate the instantaneous reactive current by means of the converter circuit.

As the instantaneous reactive current detecting apparatus known heretofore, there can be mentioned a system disclosed in an article entitled "General Analysis of Instantaneous Reactive Power and Application" contained in "Periodical of the Institute of Electrical Engineers of Japan", Vol. 103, No. 7, p.p. 483–490. This known detecting apparatus is of a much complicated circuit configuration including a three-phase/two-phase conversion circuit. Certainly, this known detecting apparatus is advantageous in that the instantaneous reactive current can be detected even when the source voltage suffers distortion in the wave form. In general, however, the waveform of the source voltage is rarely susceptible to distortion, and any significant error would not be involved even on the assumption that the source voltage is of a three-phase sinusoidal wave form. Accordingly, there exists a demand for the instantaneous reactive current detecting apparatus of much simplified circuit arrangement.

As another means for detecting and determining the instantaneous reactive power, there is known a method according to which each phase current of the power supply source is multiplied with the value of the associated phase voltage shifted by 90°, wherein the products obtained for three phases, respectively, are added together. Reference may be made to Japanese Patent Application Laid-Open No. 125035/1980 (JP-A-55-125035). However, no disclosure is contained in the above publication concerning the detection of the instantaneous reactive current.

As the reactive power compensating device, capacitors have heretofore been employed in many applications. In recent years, there arises a tendency to use active filters.

With the capacitor, only the reactive power due to lag can be compensated, and the reactive current which can be supplied is restricted only to the current of sinusoidal wave. On the other hand, with the active filter system in which GTO and/or transistors are employed, the reactive power due to the leading current can be compensated and the reactive current of the waveform other than the sinusoidal wave can also be supplied.

If the reactive current having the waveform other than the sinusoidal wave and containing harmonic components could be compensated, the harmonic current components of the power supply source could also be decreased, whereby the source waveform will be further improved when compared with the case where the capacitor is used as the reactive power compensating device. To this end, the harmonic components of the reactive current must be detected. Detection of the reactive current without time delay has, however, encountered difficulty with the hitherto known instantaneous reactive current detecting apparatus because of much complicated circuit configuration including a three-phase/two-phase conversion circuit and the like.

As another instantaneous reactive power compensating apparatus known heretofore, there can be mentioned a reactive power control in which a voltagesource type converter is employed, as disclosed in an article entitled "Operation Analysis and Designing of Instantaneous Reactive Power Compensating Apparatus Using Voltage-Source Type PWM Converter" contained in "Periodical of the Institute f Electrical Engineers of Japan", Vol. B106, No. 4, p.p. 323–330. However, neither teachings nor suggestion has ever been made as to the use of the current-source type converter and the control of the output current thereof for the purpose of compensating the instantaneous reactive power up to the possible maximum capacity of the current converter.

SUMMARY OF THE INVENTION

It is a first object of the present invention to provide an apparatus capable of detecting instantaneous reactive current in a three-phase load circuit without time delay, which apparatus can be implemented in a simplified circuit structure without need for the circuit of complicated configuration such as three-phase/two-phase conversion circuit.

A second object of the present invention is to provide an apparatus for compensating a reactive power supplied to a general purpose load circuit which includes conventional three-phase loads and is connected in parallel to a three-phase power supply source together with a converter load circuit including a current-source type converter which cooperates with the general purpose load circuit to constitute an electric system, wherein the compensation of the reactive power is accomplished by detecting the instantaneous reactive current and controlling the switching elements of the current-source type converter on the basis of the detected instantaneous reactive current.

According to a first aspect of the present invention, there is provided an apparatus for detecting an instantaneous reactive current of a three-phase load, which apparatus comprises first means for generating three phase current signals corresponding, respectively, to phase currents supplied to the three-phase load from a three-phase power supply source, the instantaneous values of the phase current signals indicating the instantaneous values of associated phase currents of the three-phase load, second means for generating sinusoidal wave signals of three phases having phase difference of 90° relative to the phase voltages of the three-phase power supply source, respectively, third means for generating a sum equivalent signal corresponding to a sum of three products which result from multiplications of the instantaneous values of the phase current signals of the three phase current signals with the instantaneous values of the sinusoidal wave signals of corresponding phases, respectively, and fourth means for determining the instantaneous reactive current in each phase of said three-phase load on the basis of the sum equivalent signal and the three phase sinusoidal wave signals.

According to a second aspect of the present invention, there is provided an apparatus for compensating by means of a current-source type three-phase converter circuit in an electric system in which a converter load circuit including the current-source type three-phase converter and the general purpose load circuit including conventional three-phase loads are connected to a three-phase power supply source, which apparatus comprises first means for determining a first value to be assumed by a control factor selected in conjunction with output current control of the converter so that the converter produces a desired output current, second means for generating a signal related to the instantaneous reactive power supplied to the general purpose load circuit, third means for determining a second value to be assumed by the control factor for compensating the instantaneous reactive power on the basis of the signal related to the instantaneous reactive power, and fourth means for controlling switching elements of the current-source type converter on the basis of said first and second values.

DESCRIPTION OF THE PREFERRED EMBODIMENTS

Now, the instantaneous reactive current detecting apparatus for a three-phase load according to an exemplary embodiment of the present invention will be described. In this conjunction, it is assumed that individual phase currents in the three-phase load are balanced with one another and no zero-phase-sequence current flows. In view of the fact that such situation is prevailing ordinarily in the conventional three-phase load, the above assumption will involve no problems as to the validity of the present invention.

Figure 1:
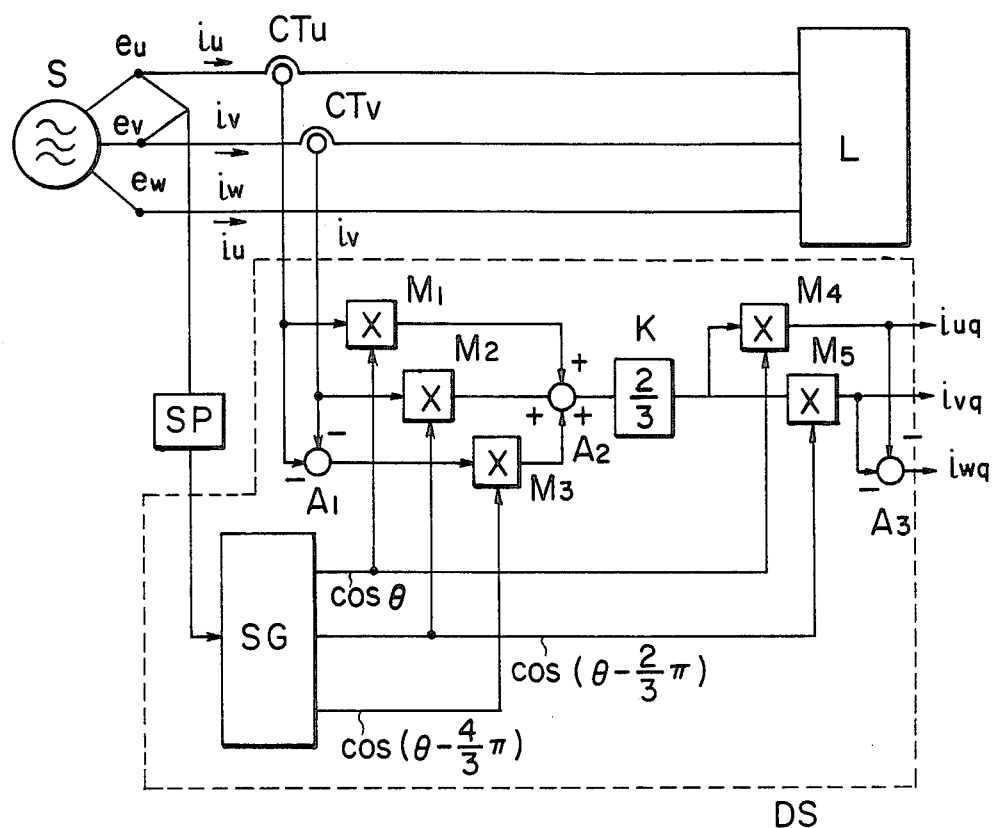
FIG. 1 is a view showing in a form of block diagram a circuit arrangement of the instantaneous reactive current detecting apparatus according to an embodiment of the present invention.

Referring to FIG. 1, three phase voltages are represented by $e_u$, $e_v$ and $e_2$, respectively, the effective value of line voltage is represented by $E_a$, and the electrical angle of u-phase is represented by which is given by $2 \cdot \pi \cdot f \cdot t$ (where f represents a source frequency). Then, the following relations apply valid among the three phase voltages $e_u$, $e_v$ and $e_w$.

$$\left. \begin{array}{l} e_u = \sqrt{2/3} \cdot E_a \cdot \sin\theta \\ e_v = \sqrt{2/3} \cdot E_a \cdot \sin(\theta - 2/3 \cdot \pi) \\ e_w = \sqrt{2/3} \cdot E_a \cdot \sin(\theta - 4/3 \cdot \pi) \end{array} \right\} \quad (1)$$

Under these conditions, relation given by the following expression (2) applies valid among the three phase currents $i_u$, $i_v$ and $i_w$ on the assumption that the zero-phase-sequence current is zero.

$$i_u + i_v + i_w = 0 \quad (2)$$

When the effective value of the phase currents $i_u$, $i_v$ and $i_w$ are represented by I with the phase difference relative to the respective phase voltages being represented by $\alpha$, the following relations apply valid.

$$\left. \begin{array}{l} i_u = \sqrt{2} \cdot I \cdot \sin(\theta + \alpha) \\ i_v = \sqrt{2} \cdot I \cdot \sin(\theta + \alpha - 2/3 \cdot \pi) \\ i_w = -(i_u + i_v) \\ \phantom{i_w} = \sqrt{2} \cdot I \cdot \sin(\theta + \alpha - 4/3 \cdot \pi) \end{array} \right\} \quad (3)$$

More specifically, the phase currents $i_u$, $i_v$ and $i_w$ are given by the following expressions.

$$\left. \begin{array}{l} i_u = \sqrt{2} \cdot I \cdot \cos\alpha \cdot \sin\theta + \sqrt{2} \cdot I \cdot \sin\alpha \cdot \cos\theta \\ i_v = \sqrt{2} \cdot I \cdot \cos\alpha \cdot \sin(\theta - 2/3 \cdot \pi) + \\ \phantom{i_v =} \sqrt{2} \cdot I \cdot \sin\alpha \cdot \cos(\theta - 2/3 \cdot \pi) \\ i_w = \sqrt{2} \cdot I \cdot \cos\alpha \cdot \sin(\theta - 4/3 \cdot \pi) + \\ \phantom{i_w =} \sqrt{2} \cdot I \cdot \sin\alpha \cdot \cos(\theta - 4/3 \cdot \pi) \end{array} \right\} \quad (4)$$

From the expressions (1) and (4), electric power P can be determined as follows:

$$P = e_u \cdot i_u + e_v \cdot i_u + e_w \cdot i_w \quad (5)$$
$$= 2/\sqrt{3} \cdot E_a \cdot I[\cos\alpha \{\sin^2\theta + \sin^2(\theta - 2/3 \cdot \pi)\} +$$
$$\sin^2(\theta - 4/3 \cdot \pi) + \sin\alpha \{\sin\theta \cdot \cos\theta +$$
$$\sin(\theta - 2/3 \cdot \pi)\cos(\theta - 2/3 \cdot \pi)\} +$$
$$\sin(\theta - 4/3 \cdot \pi) \cdot \cos(\theta - 4/3 \cdot \pi)]$$
$$= \sqrt{3} \cdot E_a \cdot I \cdot \cos\alpha + 0$$

As will be seen from the above expressions, phase current components $i_{up}$, $i_{vp}$ and $i_{wp}$ given by the first terms of the expressions (4), respectively, are active components contributing to generation of the electric power, while the phase current components $i_{uq}$, $i_{vq}$ and $i_{wq}$ given by the second terms of the expressions (4) are out of phase relative to the respective phase voltages by 90° and thus represent the reactive current components, respectively.

In the case of the single-phase system, the reactive power becomes zero after integration over one period. Thus, when the electric power undergoes change within a time span shorter than one period, the concept "reactive power" can not have positive or explicit meaning. In contrast, in the case of the three-phase power supply system, there exist the reactive currents in terms of the instantaneous values.

By connecting to the power supply source a circuit for detecting and absorbing the reactive currents, only the instantaneous effective phase currents $i_{up}$, $i_{vp}$ and $i_{wp}$ can flow to the power supply source. The phase currents flowing to the power supply source are in phase with the respective source voltages. Accordingly, the power supply source may be only of a capacity that is enough to be capable of supplying the current corresponding to the effective power.

The principle of the present invention thus resides in detection of the instantaneous reactive currents given by the second terms of the expressions (4). To this end, it is necessary to determine the common component $\sqrt{2} \cdot I \cdot \sin\theta$, which can be accomplished by determining the reactive power Q. In this connection, it is noted that the following expression holds true.

$$Q/(\sqrt{2/3} \cdot E_a) = i_u\cos\theta + i_v\cos(\theta - 2/3 \cdot \pi) + \quad (6)$$
$$i_w\cos(\theta - 4/3 \cdot \pi)$$
$$= \sqrt{2} \cdot I[\cos\alpha\{\sin\theta \cdot \cos\theta +$$
$$\sin(\theta - 2/3 \cdot \pi) \cdot$$
$$\cos(\theta - 2/3 \cdot \pi) +$$
$$\sin(\theta - 4/3 \cdot \pi) \cdot$$
$$\cos(\theta - 4/3 \cdot \pi)\} +$$
$$\{\sin\alpha(\cos^2\theta +$$
$$\cos^2(\theta - 2/3 \cdot \pi) +$$
$$\cos^2(\theta - 4/3 \cdot \pi)\}]$$
$$= 0 + 3\sqrt{2}/2 \cdot I \cdot \sin\alpha$$

In other words, the term $Q/(\sqrt{\frac{2}{3}} \cdot E_a)$ is first determined and multiplied with $\sqrt{2} \cdot I \cdot \sin\alpha$, the resulting product being then multiplied with $\cos\theta$, $\cos(\theta - \frac{2}{3} \cdot \pi)$ and $\cos(\theta - 4/3 \cdot \pi)$, respectively, to thereby determine the three phase instantaneous reactive currents $i_{uq}$, $i_{vq}$ and $i_{wq}$, respectively.

Now referring to FIG. 1, a reference character L represents a three-phase load which demands the three phase currents containing instantaneous reactive current components. This load is supplied with three phase currents $i_u$, $i_v$ and $i_w$, of which the currents $i_u$ and $i_v$ are detected by means of current transformers $CT_u$ and $CT_v$, respectively. Reference character SP designates a synchronizing pulse generator which produces a pulse on the basis of the u−v interphase voltage at every zero crossing point of the u-phase voltage, the pulse signal thus produced being then applied to a sinusoidal wave generator SG, which in turn produces three phase sinusoidal waves represented by $\cos\theta$, $\cos(\theta - \frac{2}{3} \cdot \pi)$ and $\cos(\theta - 4/3 \cdot \pi)$, respectively, with $\theta$ being set to zero at the time point at which the zero-cross pulse makes appearance. As will be seen by considering comparatively the expression (1), these sinusoidal waves are out of phase with the source voltage by a phase difference of 90°.

An adder $A_1$ serves for an additional function to determine the phase current $i_w$ in accordance with $i_w = -(i_u + i_v)$. By multiplying the instantaneous values of the three phase currents determined in this manner with the instantaneous values of the corresponding phases of the three phase sinusoidal wave forms appearing at the same time point as the instantaneous three phase current values by means of multipliers $M_1$, $M_2$ and $M_3$, respectively, and subsequently adding together the products thus obtained by means of an adder $A_2$, the value given by the term $3\sqrt{2}/2 \cdot I \cdot \sin\theta$ in the expression (6) can be determined. Then, by multiplying the value thus determined with a factor of $\frac{2}{3}$, there can be obtained a value of $\sqrt{2} \cdot I \cdot \sin\alpha$, which is then multiplied with $\cos\theta$ and $\cos(\theta - \frac{2}{3} \cdot \pi)$ by multipliers $M_4$ and $M_5$, respectively, to thereby determine the two phase instantaneous reactive currents $i_{uq}$ and $i_{vq}$ by means of an adder $A_3$. By inverting the polarity of the sum output of the adder $A_3$, the instantaneous reactive current $i_{wq}$ of the other phase can be determined.

When the current transformers $CT_u$ and $CT_v$ are each of the type in which an A/D converter is incorporated, the circuit portion indicated as enclosed by a broken line block in FIG. 1 can be implemented in the form of digital circuit DS which may be preferably constituted by a microcomputer.

In the case of the illustrative embodiment shown in FIG. 1, the instantaneous reactive current $i_w$ of one phase is arithmetically determined from the instantaneous reactive currents $i_u$ and $i_v$ of the other two phases. However, it goes without saying that the reactive current $i_w$ may be determined by another current transformer provided in addition to the transformers $CT_u$ and $CT_v$. It should further be added that the instantaneous reactive current $i_{wq}$ may also be determined through multiplication of $\cos(\theta - 4/3 \cdot \alpha)$, since $\sqrt{2} \cdot I \cdot \sin\alpha$ has been already known.

Next, description will be made on an apparatus for compensating the reactive power of a three-phase load by a converter load circuit including a three-phase current-source type converter connected in parallel with the three-phase load, wherein the instantaneous reactive current detector for a three-phase load described above by reference to FIG. 1 is made use of.

Figure 3:
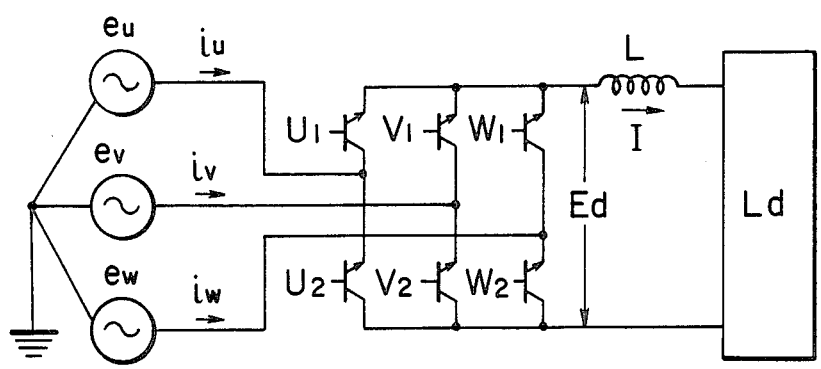
FIG. 3 is a view showing a load circuit including a current-source type converter connected to a three-phase power supply source.

FIG. 3 is a circuit diagram showing an arrangement of a three-phase full-wave current converter of transistorized type. Reference symbols $U_1$, $U_2$; $V_1$, $V_2$; $W_1$ and $W_2$ designate switching elements, respectively, each of which may be constituted, for example, by a reverse blocking transistor module composed of a transistor and a diode connected in series to each other. In the figure, only transistors are shown for simplification of the illustration and those transistors attached with suffix "1" are located on the positive polarity side while those attached with suffix "2" are disposed on the negative polarity side. A DC current I flows through a DC output circuit of the converter to which a load $L_d$ is connected by way of a DC reactor L. The load $L_d$ may be a simple DC load such as a DC motor or an AC load such as a three-phase induction motor connected by way of an inverter.

A power supply source generates three phase sinusoidal wave voltages $e_u$, $e_v$ and $e_w$ which are balanced with one another. When the phase angle of the u-phase voltage is represented by $\theta$, these phase voltages $e_u$, $e_v$ and $e_w$ are given by the aforementioned expression (1).

Figure 4A:
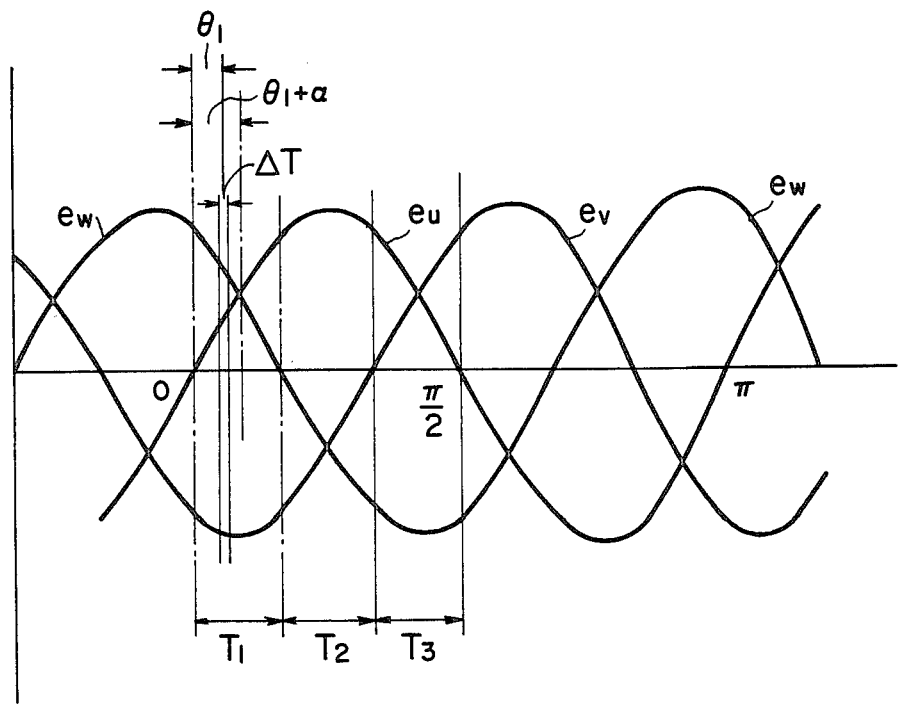
FIGS. 4A and 4B are views for illustrating operation of switching elements constituting major parts of the current-source type converter shown in FIG. 3.
Figure 4B:
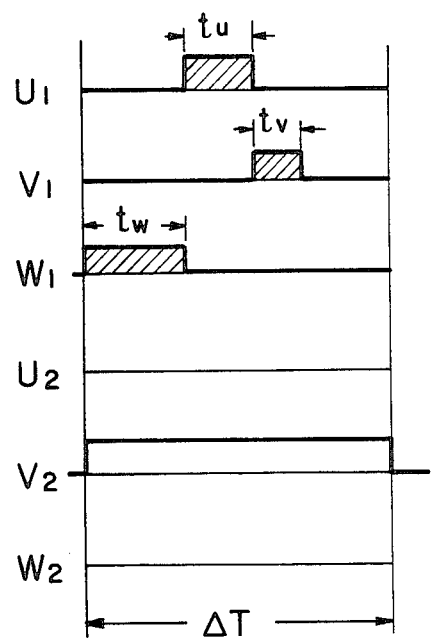

Now, the control of the switching elements which constitute major parts of the current-source type converter will be elucidated by referring to FIGS. 4A and 4B. FIG. 4A illustrates individually the phase voltage waveforms $e_u$, $e_v$ and $e_w$ of the three-phase voltage supply source. For convenience's sake of description, an interval $T_1$ (corresponding to an electrical angle range of 0°–60°) will be considered in which only the v-phase voltage is negative with the u- and w-phase voltages being positive. During this interval $T_1$, the switching element $V_2$ is conducting. On the other hand, conduction of the switching elements $U_1$, $V_1$ and $W_1$ are so controlled that when the abovementioned interval $T_1$ is divided into a plurality of sub-intervals $\Delta T$, the conduction time of the switching elements in each sub-interval $\Delta T$ is determined by the instantaneous values of the respective phase voltages making appearance during the sub-interval $\Delta T$. More specifically, it is assumed that the zero-cross point of the phase angle $\theta$ is such as illustrated in FIG. 4A. Then, from the expression (1), the instantaneous values of the phase voltages in the sub-interval $\Delta T$ can be expressed as follows:

$$e_u = K \cdot \sin\theta_1$$

$$e_v = K \cdot \sin(\theta_1 - \tfrac{2}{3}\pi)$$

$$e_w = K \cdot \sin(\theta_1 - 4/3\pi)$$

where K represents a constant determined by the effective value of the interphase voltage. Accordingly, the time intervals $t_u$, $t_v$ and $t_w$ during which the switching elements $U_1$, $V_1$ and $W_1$ become conductive as illustrated in FIG. 4B are, respectively, given by $$t_u = K' \cdot \sin\theta_1$$

$$t_v = K' \cdot \sin(\theta_1 - \tfrac{2}{3}\pi)$$

$$t_w = K' \cdot \sin(\theta_1 - 4/3\pi)$$

where K' represents a coefficient which can be selectively determined in consideration of the desired value of the output current of the current-source type converter.

As will be seen from the foregoing, during the periods $t_u$ and $t_w$ in the sub-interval $\Delta T$, currents of positive polarity flow from the power supply source toward the load in the phases u and w, while a corresponding current of the negative polarity will flow toward the power supply source from the load in the phase v. During the period $t_v$, only the circulating current can flow through a closed loop formed by the load $L_d$ and the switching elements $V_1$ and $V_2$ under the effect of energy stored in a reactance L, and no current flows from the power supply source to the load $L_d$. In other words, when the only current flow between the power supply source and the load is considered, it is safe to say that currents of positive polarity flow from the power supply source toward the load during the periods $t_u$ and $t_w$ in the phases u and w, respectively, while the current flow with negative polarity takes place in the phase v during the same periods.

Here, definition will be made concerning the terminology. The ratio to the sub-interval $\Delta T$ of the period during which the current of positive polarity flows from the power supply source toward the load in each phase will be referred to as the positive duty factor, while the ratio to the sub-interval $\Delta T$ of the period during which the negative current flow takes place is referred to as the negative duty factor. The duty factors $\gamma u$, $\gamma v$ and $\gamma w$ in the phases u, v and w (which may be considered to be equivalent to the duty factors of the switching elements $U_1$, $V_1$ and $W_1$ in the case of the illustrated embodiment) can be expressed as follows:

$$\begin{aligned}
\gamma_u &= \tfrac{K'}{\Delta T} \cdot \sin\theta_1 \\
\gamma_v &= -(\gamma_u + \gamma_w) = \\
&\quad -\tfrac{K'}{\Delta T} \cdot \left\{ \sin\theta_1 + \sin\left(\theta_1 - \tfrac{4}{3}\pi\right)\right\} \\
&= \tfrac{K'}{\Delta T} \cdot \sin\left(\theta_1 - \tfrac{2}{3}\pi\right) \\
\gamma_w &= \tfrac{K'}{\Delta T} \cdot \sin\left(\theta_1 - \tfrac{4}{3}\pi\right)
\end{aligned} \quad (7)$$

and $$\gamma_u + \gamma_v + \gamma_w = 0 \quad (8)$$

The foregoing elucidation is based on the assumption that the conduction time of each switching element in the sub-interval $\Delta T$ is proportional to the instantaneous value of the associated phase voltage in the sub-interval $\Delta T$. However, in practice, the conduction time interval of each switching element can be so determined as to be proportional to the instantaneous value of the corresponding phase voltage at the time point corresponding to the phase shift $\gamma$ relative to $\theta_1$ by $\Delta T$, i.e. proportional to the instantaneous value of the corresponding phase voltage at the phase angle of ($\theta = \gamma$ as illustrated in FIG. 4A in the case of the illustrated embodiment. Similar relations apply valid to the intervals $T_2$, $T_3$, ... and so forth following the interval $T_1$. When $K'/\Delta T$ occurring in the expressions (7) is represented by $\gamma$, the duty factors of the switching elements can be generally expressed as follows:

$$\begin{aligned}
\gamma_u &= \gamma \cdot \sin(\theta + \alpha) \\
\gamma_v &= \gamma \cdot \sin\left(\theta + \alpha - \tfrac{2}{3}\pi\right) \\
\gamma_w &= \gamma \cdot \sin\left(\theta + \alpha - \tfrac{4}{3}\pi\right)
\end{aligned} \quad (9)$$

It will be noted that the value of $\gamma$ can not exceed "1" as is apparent from the aforementioned expression (7) which defines the duty factor. Further, it should be mentioned that the value resulting from multiplication of the duty factor given by the above expression (9) with the amplitude I of the corresponding phase current at the time when $\gamma=1$ indicates the source current in the corresponding phase. Accordingly, when the effective value of the interphase voltage is represented by $E_a$, the electric power P at that time can be given by the following expression (10) independently of the electrical angle in the u-phase voltage.

$$P = \sqrt{\frac{3}{2}} \cdot E_a \cdot I \cdot \gamma \cdot \cos\alpha \quad (10)$$

Since this AC power must coincide with the DC power, the DC output voltage $E_d$ can be determined in accordance with $$E_d = \sqrt{\frac{3}{2}} \cdot E_a \cdot \gamma \cdot \cos\alpha \quad (11)$$

On the other hand, the reactive power q can be determined in accordance with $$q = \sqrt{\frac{3}{2}} \cdot E_a \cdot I \cdot \gamma \cdot \sin\alpha \quad (12)$$

The above expressions show that the output voltage can be controlled by controlling the duty factor $\gamma$ with the phase angle $\alpha$ being set equal to 0 (zero), while the reactive power can be controlled by controlling the factor $\gamma$ with $\alpha$ being set to $\pi/2$.

When the duty factor for controlling the DC output voltage $E_d$ is represented by $\gamma d$ with the factor for controlling the reactive power being represented by $\gamma_q$, the duty factor $\gamma$ and the phase angle $\alpha$ at which both of the DC output voltage and the reactive power take desired values are given by the following expressions (13) and (14), respectively.

$$\gamma = \sqrt{\gamma_d^2 + \gamma_q^2} \quad (13)$$

$$\alpha = \tan^{-1}\frac{\gamma_q}{\gamma_d} \quad (14)$$

It should, however, be understood that $\alpha$ is not in the range of $\pi/2$ to $-\pi/2$ as adopted generally but assumes a value in the range of $\pi$ to $-\pi$ in dependence on the polarity of the duty factors $\gamma_q$ and $\gamma_d$.

In the case of the current-source type converter, the duty factor $\gamma_d$ for controlling the output voltage can be arithmetically derived from the difference between the current command value and the output current value.

The duty factor $\gamma_q$ for controlling the reactive power can be determined as the value of $\gamma$ at which the reactive power Q to be compensated for is equal to the value q determined in accordance with the expression (12) on the assumption that $\sin\alpha = 1$. That is, $$\gamma = \frac{Q}{\sqrt{3/2} \cdot E_a \cdot I} \quad (15)$$

Figure 5:
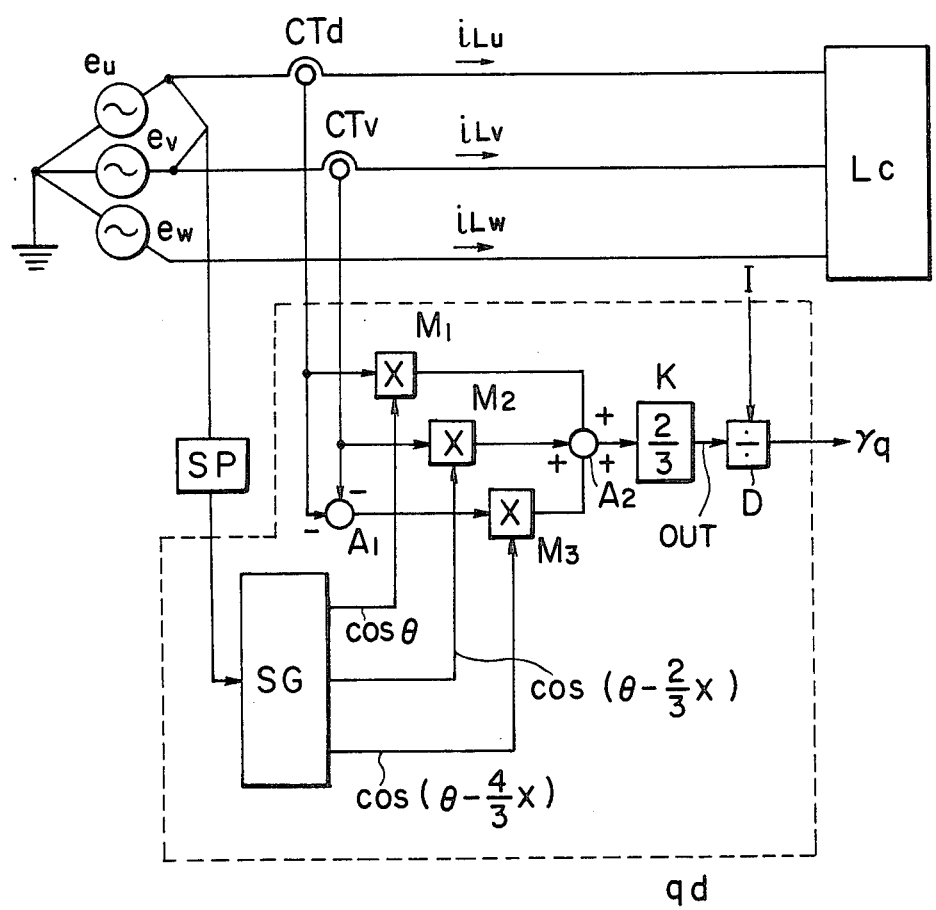
FIG. 5 is a view showing a circuit arrangement of the instantaneous reactive current detecting apparatus shown schematically in FIG. 2.

An apparatus for detecting the reactive power in a three-phase load circuit is shown in FIG. 5. In the figure, reference character $q_d$ denotes a reactive current detecting circuit which is substantially same as the one shown in FIG. 1 except for insignificant difference in the output circuit arrangement. Accordingly, it will be appreciated from the description made hereinbefore in conjunction with FIG. 1 that the output value appearing at a circuit OUT in FIG. 5 can be expressed as follows:

$$\frac{Q}{\sqrt{3/2} \cdot E_a}$$

Thus, by dividing the above output value at the circuit point OUT by the output current I of the converter by means of a divider D, there can be obtained the duty factor $\gamma_q$ defined by the aforementioned expression (15).

Figure 2:
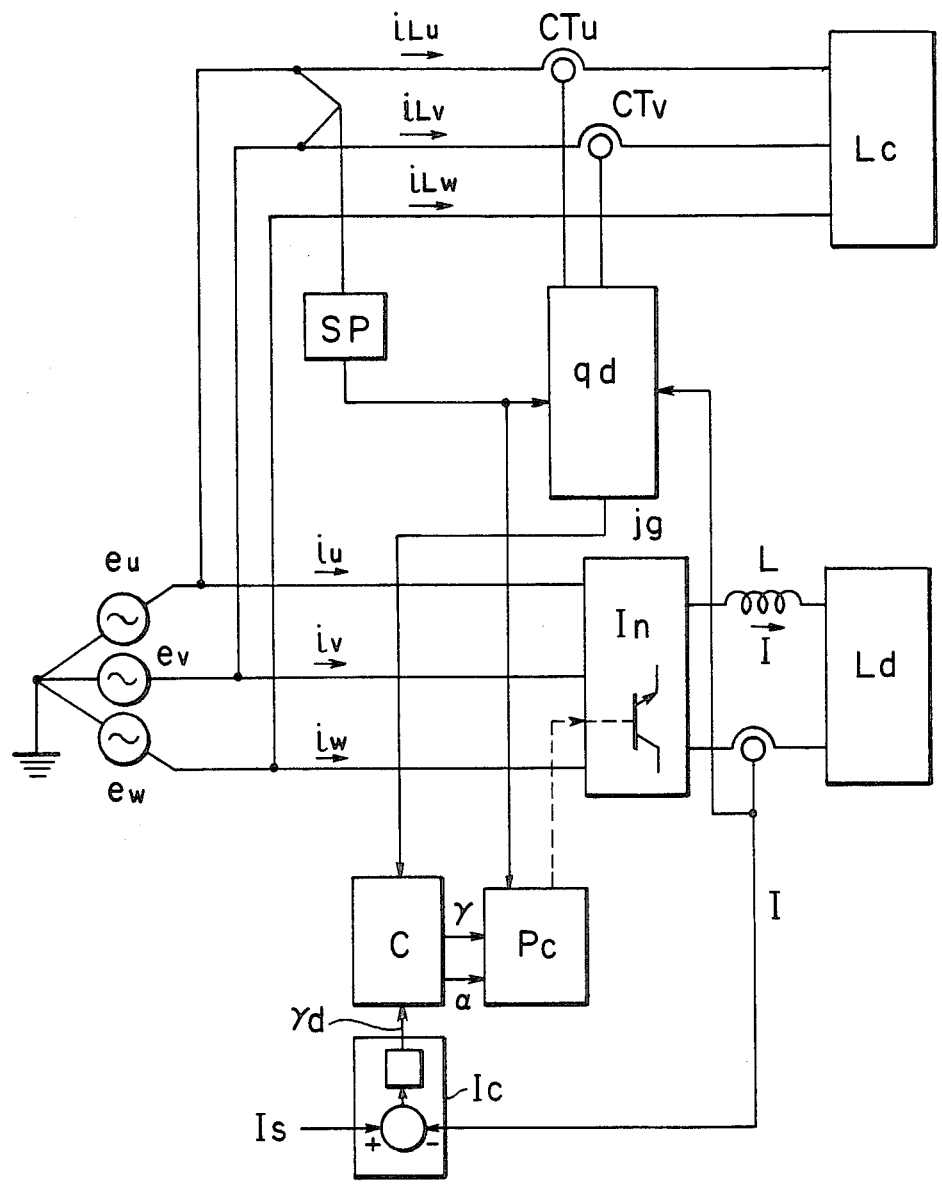
FIG. 2 is a view showing in a form of block diagram a circuit arrangement of the apparatus for compensating a reactive power in a three-phase load circuit by means of a current-source type converter according to another embodiment of the present invention.

On the basis of the principle taught above, it is possible to implement an apparatus for compensating the reactive power of a three-phase load by means of a converter circuit including a current-source type three-phase converter connected in parallel to the load. An exemplary embodiment of such apparatus is shown in FIG. 2. In the figure, reference character In designates a converter main circuit composed of six transistor switching elements $U_1, \ldots, W_2$. A current control circuit $I_c$ serves to compare a DC current I detected by a current transformer $CT_d$ with a current command $I_s$ to arithmetically determine the duty factor $\gamma_d$ which is then supplied to an arithmetic unit C. The duty factor $\gamma_q$ is detected by a reactive power detector $q_d$ shown in FIG. 5 and applied to the arithmetic unit C, which in turn determines the duty factor $\gamma$ and the phase angle $\alpha$ from the duly factors $\gamma_d$ and $\gamma_q$ in accordance with the equations (13) and (14), respectively.

In FIG. 2, a symbol $P_c$ designates a circuit for generating a pulse signal to control the converter main circuit, which circuit $P_c$ is constituted by a microcomputer and has the inputs supplied with the factor $\gamma$, phase angle $\alpha$ and the synchronizing pulse signal produced by the synchronizing pulse generator SP.

The electrical angle $\theta$ of the u-phase voltage is determined with reference to the synchronizing pulse signal and added with $\alpha$ to obtain "$\theta+\alpha$", being followed by determination of the terms "$\sin(\theta-\alpha)$" and "$\sin(-\theta+\alpha-\frac{2}{3}\cdot\pi)$" to determine subsequently the duty factors defined by the expressions (9) through multiplication with $\gamma$.

By multiplying the duty factor thus determined with a carrier period (corresponding to the sub-interval $\Delta T$ shown in FIG. 4A), a corresponding pulse duration can be determined. When the pulse durations are determined for two phases, the pulse duration for the remaining phase can be readily derived from the two pulse durations in accordance with the aforementioned expression (8). For the conducting period in which the input current is zero, the switching transistor elements belonging to the same phase and disposed on the negative and positive sides, respectively, may be fired with the number of chopping times being decreased as small as possible.

The functions mentioned above can be easily accomplished with the aid of a one-chip microcomputer.

Figure 6:
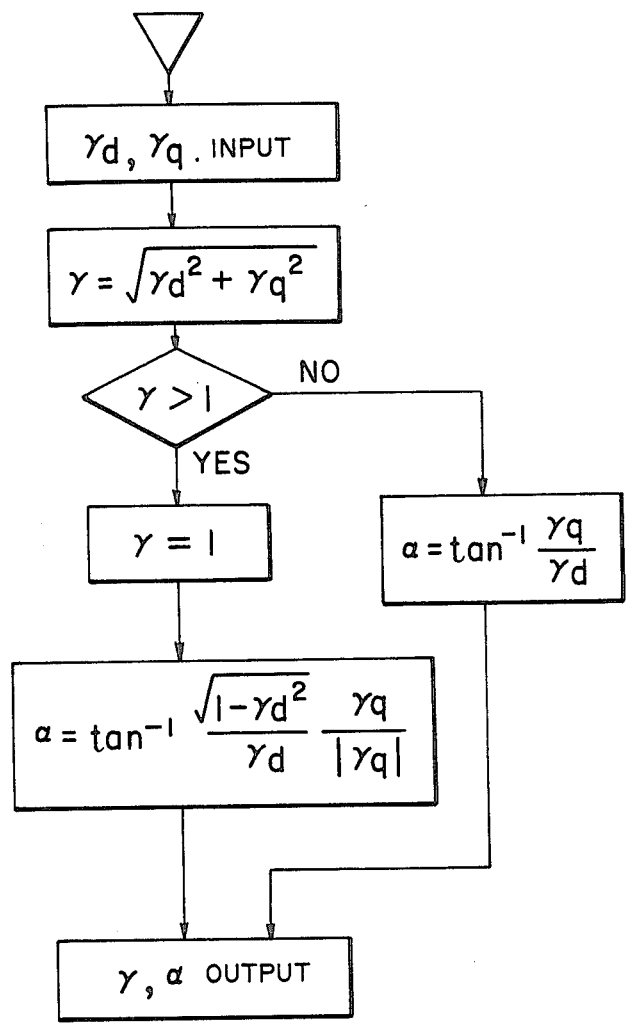
FIG. 6 is a view for illustrating in a flow chart operation of an arithmetic unit shown in FIG. 2.

As mentioned hereinbefore, the factor $\gamma$ is not allowed to exceed "1" (one). Accordingly, when the value of $\gamma$ calculated in accordance with the expression (6) should go beyond "1", it is necessary to limit the value of $\gamma$ to "1". The arithmetic operation performed by the arithmetic unit C in this conjunction is illustrated in a flow chart in FIG. 6. More specifically, when the value of $\gamma$ determined from $\gamma_d$ and $\gamma_q$ in accordance with the expression (13) exceeds "1", either of the duty factor components $\gamma_d$ or $\gamma_q$ must be reduced. In this connection, it is noted that when the duty factor $\gamma_d$ is reduced, there can no more be obtained the requisite DC output voltage, resulting in that the DC current I can not follow the current command $I_s$. Under the circumstances, the reactive power component $\gamma_q$ is reduced to prevent the value $\gamma$ from going beyond "1". In other word, $\gamma$ is limited to "1" by setting the value of $\gamma_q$ equal to $\sqrt{1-\gamma_d^2}$ while the corresponding value of $\alpha$ is determined in accordance with $$\alpha = \tan^{-1} \frac{\sqrt{1-\gamma_d^2}}{\gamma_d} \cdot \frac{\gamma_q}{|\gamma_q|} \quad (16)$$

In the above expression, multiplication with $(\gamma_q/|\gamma_q|)$ is for the purpose of determining accurately the quadrant of $\alpha$.

The present invention can be advantageously adopted in such application where the load $L_d$ is constituted by a lift car system in a building and the instantaneous reactive power of the other loads $L_c$ present within that building are to be compensated, whereby the power supply demand for all the loads in the building are to be managed satisfactorily in a coordinated manner.

We claim:

1. In an electric system in which a converter load circuit including a current-source type three-phase converter and a general purpose load circuit including conventional three-phase loads are connected in parallel to a three-phase power supply source, an apparatus for compensating a reactive power supplied to said general purpose load circuit be means of said converter circuit, comprising:

first means for determining a first value selected in conjunction with output current control of said converter so that said converter produces a desired output current;

second means for generating a signal related to the instantaneous reactive power supplied to said general purpose load circuit;

third means for determining a second value for compensating said instantaneous reactive power on the basis of said signal related to said instantaneous reactive power; and fourth means for controlling switching elements of said current-source type converter on the basis of a control factor calculated from said first and second values.

2. An apparatus according to claim 1, wherein said control factor is a duty factor indicative of the ratio of time for which the switching element in each phase of said converter is made conductive.

3. An apparatus according to claim 2, wherein said fourth means includes an arithmetic unit for arithmetically determining a control value $\gamma = \sqrt{\gamma_d^2 + \gamma_q^2}$ for said duty factor and a control value $\alpha = \tan^{-1}(\gamma_q/\gamma_d)$ for a phase angle from value $\gamma_d$ corresponding to said first value and a value $\gamma_q$ corresponding to said second value and a control circuit for controlling electric conduction of the switching elements of said converter on the basis of said control value for said duty factor and said control value for said phase angle.

4. An apparatus according to claim 3, wherein when the arithmetically determined value of said control value $\gamma$ for said duty factor exceeds "1" (unity), said control value $\gamma$ is set equal to "1", while the control value $\alpha$ for the phase angle is determined such that $\alpha = \tan^{-1}(\sqrt{1-\gamma_d^2}/\gamma_d) \cdot (\gamma_q/|\gamma_q|)$.

* * * * *